United States Patent [19]

Ivanov et al.

[11] Patent Number: 5,653,856
[45] Date of Patent: Aug. 5, 1997

[54] METHODS OF BONDING TARGETS TO BACKING PLATE MEMBERS USING GALLIUM BASED SOLDER PASTES AND TARGET/BACKING PLATE ASSEMBLIES BONDED THEREBY

[75] Inventors: Eugene Y. Ivanov, Grove City, Ohio; Tatyana F. Grigoriva, Spartaka; Vladimir V. Boldyrev, Tereshkova, both of Russian Federation

[73] Assignee: Tosoh SMD, Inc., Grove City, Ohio

[21] Appl. No.: 684,319

[22] Filed: Jul. 19, 1996

Related U.S. Application Data

[63] Continuation of Ser. No. 340,168, Nov. 15, 1994, abandoned.

[51] Int. Cl.$^6$ .................................................. C23C 14/34
[52] U.S. Cl. .................... 204/192.12; 204/298.12; 204/298.21; 228/248.1; 228/262.9; 420/489; 420/560
[58] Field of Search .................... 204/298.12, 298.21, 204/192.12, 192.29; 428/642; 228/111.5, 248.1, 262.51, 262.61, 262.9; 420/470, 489, 560, 455

[56] References Cited

U.S. PATENT DOCUMENTS

| | | | |
|---|---|---|---|
| 3,141,238 | 7/1964 | Harman, Jr. | 29/498 |
| 3,296,017 | 1/1967 | Rubin | 117/119.8 |
| 3,497,944 | 3/1970 | Antle | 29/494 |
| 3,676,916 | 7/1972 | Schierding et al. | 29/419 |
| 3,839,780 | 10/1974 | Freedman et al. | 29/501 |
| 3,949,118 | 4/1976 | Nagano et al. | 427/57 |
| 3,999,962 | 12/1976 | Drui et al. | 51/307 |
| 4,007,040 | 2/1977 | Kropp | 75/165 |
| 4,015,948 | 4/1977 | Tsuda | 75/157.5 |
| 4,278,622 | 7/1981 | Suh | 264/11 |
| 4,290,876 | 9/1981 | Nishiyama et al. | 204/298.12 X |
| 4,299,629 | 11/1981 | Haack | 75/251 |
| 4,312,896 | 1/1982 | Armstrong | 427/96 |
| 4,321,289 | 3/1982 | Bartsch | 427/287 |
| 4,341,816 | 7/1982 | Lauterbach et al. | 427/34 |
| 4,398,975 | 8/1983 | Ohsawa et al. | 148/400 |

(List continued on next page.)

FOREIGN PATENT DOCUMENTS

| | | |
|---|---|---|
| 63-235469 | 3/1987 | Japan . |
| 196529 | 6/1967 | U.S.S.R. . |
| 228507 | 1/1968 | U.S.S.R. . |
| 238214 | 3/1969 | U.S.S.R. . |
| 241949 | 8/1969 | U.S.S.R. . |
| 245526 | 10/1969 | U.S.S.R. . |
| 264140 | 6/1970 | U.S.S.R. . |
| 293602 | 1/1971 | U.S.S.R. . |
| 291769 | 1/1971 | U.S.S.R. . |
| 288522 | 2/1971 | U.S.S.R. . |
| 562399 | 8/1977 | U.S.S.R. . |
| 579109 | 11/1977 | U.S.S.R. . |
| 4725973 | 3/1990 | U.S.S.R. . |

OTHER PUBLICATIONS

"Mat. Sci & Tech" ed. Cahn, Haasen & Kramer, vol. 15 ed. R. Cahn; Mechanical Milling and Alloying, Chapter 5 VCH Winheim, Germany, 1991.

Reactive Mechanical Alloys in Material Synthesis E. Ivanov; Journal of Materials Synthesis and Processing, vol. 1, No. 6, 1993.

Primary Examiner—Nam Nguyen
Attorney, Agent, or Firm—Biebel & French

[57] ABSTRACT

Methods of solder bonding sputter targets to backing plate members and solder bonded target/backing plate assemblies are disclosed wherein a gallium containing solder paste is used to bond adjoining target and backing plate surfaces. This paste comprises a gallium or gallium alloy liquid component and a finely divided solid solution component comprising at least one metal from groups IB, VIII, and IVB of the periodic chart and at least one metal from groups IVA, IIIA and VA of the periodic chart. The solder paste is applied to the surfaces to be soldered and is allowed to solidify. A durable solder bond is formed that is capable of withstanding high temperatures on the order of about 500° C. without failure.

32 Claims, 2 Drawing Sheets

U.S. PATENT DOCUMENTS

| | | | |
|---|---|---|---|
| 4,459,166 | 7/1984 | Dietz et al. | 156/89 |
| 4,476,151 | 10/1984 | Keller et al. | 204/298.12 |
| 4,486,631 | 12/1984 | Naya et al. | 200/144 B |
| 4,569,745 | 2/1986 | Nagashima | 204/298.12 |
| 4,624,871 | 11/1986 | Maximovich et al. | 427/431 |
| 4,659,384 | 4/1987 | Daigo et al. | 420/555 X |
| 4,690,745 | 9/1987 | Klein | 204/192.29 |
| 4,739,920 | 4/1988 | Kujas | 228/207 |
| 4,747,889 | 5/1988 | Nishio et al. | 148/437 |
| 4,904,362 | 2/1990 | Gaertner et al. | 204/298.21 X |
| 4,931,092 | 6/1990 | Cisar et al. | 75/244 |
| 5,010,387 | 4/1991 | Dunaway et al. | 357/70 |
| 5,010,388 | 4/1991 | Sasame et al. | 357/70 |
| 5,021,300 | 6/1991 | Stacey | 428/620 |
| 5,053,195 | 10/1991 | MacKay | 420/555 |
| 5,066,544 | 11/1991 | Betrabet et al. | 428/614 |
| 5,066,614 | 11/1991 | Dunaway et al. | 437/209 |
| 5,098,656 | 3/1992 | Zimmerman et al. | 420/526 |
| 5,108,973 | 4/1992 | Satek et al. | 502/204 |
| 5,126,102 | 6/1992 | Takahashi et al. | 419/2 |
| 5,186,379 | 2/1993 | Helber, Jr. | 228/116 |
| 5,225,157 | 7/1993 | McKay | 420/489 X |
| 5,248,079 | 9/1993 | Li | 228/121 |
| 5,266,522 | 11/1993 | Di Giacomo et al. | 437/192 |
| 5,269,899 | 12/1993 | Fan | 204/298.09 |
| 5,280,414 | 1/1994 | Davis et al. | 361/795 |
| 5,282,943 | 2/1994 | Lannutti et al. | 204/192.12 |
| 5,296,242 | 3/1994 | Zander | 424/717 |

METHODS OF BONDING TARGETS TO BACKING PLATE MEMBERS USING GALLIUM BASED SOLDER PASTES AND TARGET/BACKING PLATE ASSEMBLIES BONDED THEREBY

This is a continuation of application Ser. No. 340,168 filed Nov. 15, 1994, now abandoned.

FIELD OF THE INVENTION

The present invention pertains to methods of bonding sputter targets to associated backing plate members and to bonded assemblies comprising target and backing plate joined by a gallium containing solder paste material.

BACKGROUND OF THE INVENTION

Cathodic sputtering is widely used for the deposition of thin layers of material onto desired substrates. Basically, this process requires a gas ion bombardment of the target having a face formed of a desired material that is to be deposited as a thin film or layer on a substrate. Ion bombardment of the target not only causes atoms or molecules of the target material to be sputtered, but imparts considerable thermal energy to the target. This heat is dissipated by use of a cooling fluid typically circulated beneath or around a backing plate that is positioned in heat exchange relation with the target.

The target forms a part of a cathode assembly which together with an anode is placed in an evacuated chamber that contains an inert gas, preferably argon. A high voltage electrical field is applied across the cathode and anode. The inert gas is ionized by collision with the electrons ejected from the cathode. Positively charged gas ions are attracted to the cathode and, upon impingement with the target surface, dislodge the target material. The dislodged target materials traverse the evacuated enclosure and deposit as a thin film on the desired substrate that is normally located proximate the anode.

In conventional target cathode assemblies, the target is attached to a nonmagnetic backing plate. The backing plate is normally water-cooled to carry away the heat generated by the ion bombardment of the target. Magnets are typically arranged beneath the backing plate in well-known dispositions in order to form the above-noted magnetic field in the form of a loop or tunnel extending around the exposed face of the target.

In order to achieve good thermal and electrical contact between the target and the backing plate, these members are commonly attached to each other by use of soldering, brazing, diffusion bonding, clamping, epoxy cements, or with interlocking annular members.

The use of indium tin oxide coatings has increased due to their demand in conjunction with the production of conductive transparent layers on paper, or glass and transparent conductivity layers in liquid crystal devices.

These materials are popularly coated via cathodic sputtering techniques wherein an indium tin oxide sputter target and copper backing plate assembly are employed in the process. Typically, in these target and backing plate assemblies, the target is bonded to the backing plate by means of an indium tin solder which may have a melting point of about 150°–160° C.

Heating of the target and backing plates to such temperatures to melt the solder is problematic in that the brittle indium tin oxide target may crack and the copper backing plate may warp or shrink. The problem is exacerbated by the current trend toward use of increasingly larger size target/backing plate assemblies.

Similar problems exist in the bonding of titanium targets to corresponding aluminum or copper backing plate members. The use of Ti and Ti alloy layers is increasing in semiconductor applications and accordingly, there is an increased demand for Ti and Ti alloy sputter targets.

Conventionally, these Ti target and Cu backing plate materials are solder bonded by Sn and Ag solders which have liquidus temperatures in excess of about 200° C. When the Ti or Ti alloy target/Al or Cu backing plate members are so heated, the large difference in thermal expansion properties between the two leads to bonding problems caused by part warpage and differential part contraction.

Diffusion bonding of Ti target/Al backing plate assemblies has proven very successful. However, with the advent of extra large target/backing plate assemblies as called for by current commercial demand, the purchase of large scale diffusion bonding presses poses a significant capital expenditure item.

In another sputter target development, tubular tin indium oxide targets have been provided to sputter coat large display panels. These targets are mounted over a coaxial, tubular backing member. In the past, it has been difficult to bond the target to the backing member along the annular target-backing member interface due to the curvature of the interfacial surfaces. Additionally, when the difference between the thermal expansion coefficients of the target and backing plate metals is great, the warpage and differential part contraction problems referred to above are presented.

Accordingly, there remains a need for a soldering method that is capable of providing a durable bond that may be applied to the requisite sputter target/backing plate interface at low temperatures.

There remains an even more specific need for the provision of a soldering method that may be employed to solder bond brittle ceramic target materials such as indium tin oxide materials including tubular indium tin oxide targets to a backing plate and titanium or titanium alloy materials to aluminum or copper backing plates.

SUMMARY OF THE INVENTION

These and other objects are met by the methods and solder bonded assemblies hereof.

In general, oxide-ceramic targets such as indium tin oxide targets and their associated backing plates as well as titanium and titanium alloy targets and their corresponding backing plates may be solder joined or bonded by use of metallic glue type solders or pastes.

The metallic glue type solders or pastes comprise a low melting liquid gallium or gallium containing alloy component and a mechanically alloyed solid solution component. The liquid component and mechanically alloyed component are mixed to form a paste which is then applied along the target, backing plate interface. The solder paste is then allowed to solidify to provide a solid metal bond, bonding the target to the backing plate.

BRIEF DESCRIPTION OF DRAWING

The invention will be further described in conjunction with the drawings and detailed description in the drawings.

DETAILED DESCRIPTION OF THE DRAWING

Figure 1:
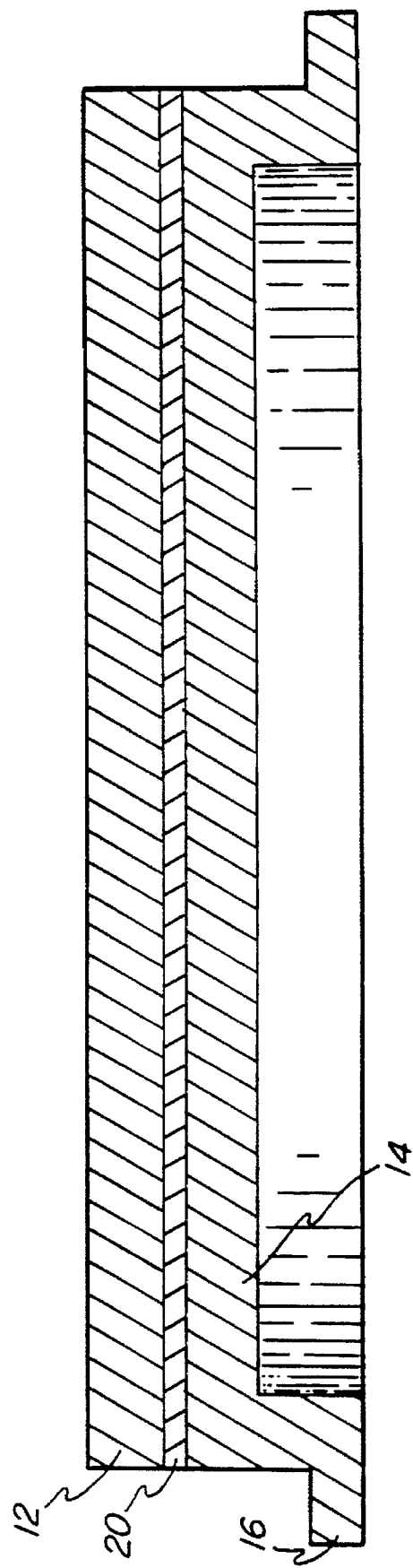
FIG. 1 is a simplified transverse cross-sectional view of a bonded target/backing plate assembly in accordance with the invention.

Turning now FIG. 1 of the drawings, there is shown a solder bonded target/backing plate in accordance with the invention. Target 12 is superposed atop heat conductive backing plate 14. As shown, a peripheral flange 16 integral with backing plate 14 serves to mount the assembly as a cathode in an evacuated sputter coating chamber in accordance with well-known techniques.

Along the interface defined by the underside of target 12 and top surface of backing plate 14, metallic glue solder 20 is disposed to thereby bond the target and backing plate together.

The metallic glues used to bond the target to the backing plate are composed of a component that is normally a liquid at room temperature (i.e. 30° C.–40° C. or less) and a solid solution component. The liquid may comprise elemental Ga or a Ga based alloy such as eutectic 62.5 Ga, 21.5 In, 16 Sn; 75.5 Ga, 24.5 In; or 95 Ga, 5 In. The liquid component may be purchased or, in the case of the liquid alloys, can be prepared by melting the requisite metals together in the desired wt. proportions.

The solid solution component comprises at least two metals and is prepared by mechanical alloying techniques such as ball milling the elements to provide a fine particle, powder like solid solution or extended solid solution of at least two metals.

The liquid component is present in an amount of about 75 wt. %–35% of the combined weight of the liquid and solid solution. Preferably, the liquid component is present in an amount of about 65%–55 wt. %. Accordingly, the solid solution component may be present in an amount by weight of 25–65 wt. %, preferably 35–45 wt. %.

The mechanically alloyed solid solution comprises a mechanically alloyed mixture of metal components (a) and (b) wherein (a) is a member or members selected from metals of groups IB, VIII and IVB of the periodic chart. The second class of metals (b) consists of metals from the groups IV A, IIIA and VA of the periodic chart.

The metal components (a) and (b) of the solid solution may be present (based upon total weight of (a) and (b)) in an amount of about 60–80 wt. % (a) and 40–20 wt. % (b). The component (a) metals are generally higher melting than the (b) components. More specifically, metal components (a) have melting points on the order of about 1000° C.–1875° C. Conversely, the metal (b) components have melting points of less than about 1000° C.

Component (a) preferably comprises a member or members selected from Cu, Fe, Co, Ni, or Ti. Component (b) preferably comprises one or more of Ge, Sn, Pb, Al, Bi, Ga, or In. This alloy (a) and (b) should show a solid solution x-ray diffraction and particle sizes should be on the order of 5 to 100 microns.

Based upon presently available data the preferred liquid component is a liquid alloy comprised of 62.5% Ga, 21.5 In, 16 Sn. This is a eutectic alloy having a liquidus temperature of 10.7° C. Another liquid component that may be mentioned is 63.14% In–32.10% Bi–4.76% Ga. This latter component has a m.p. of about 40° C.

As to the solid solution, this preferably comprises a Cu—Sn alloy, most preferably Cu 20–25 wt. % Sn. Mechanical alloying of this mixture is achieved by well-known techniques such as high energy ball milling as described in *Material Science And Technology*, editors Cahn, Haasen and Kramer, Volume 15, 1991, pp. 194–198. The mixed powders are worked in a ball mill for a period of time depending on milling conditions such as ball to powder charge ratio, rotation speed, etc. Generally, the mixed powders are mechanically alloyed for a period of about 30 minutes to 2 hours, with 90 minutes being preferred. This results in a solid solution having particles on the order of between about 5–100 microns with crystal sizes within the nanocrystalline range, normally from about 2–100 nm. Other mechanically alloyed solid solutions that can be mentioned are the Cu—In, Cu—Ga, and Cu—Bi solid solutions.

Based upon presently available data, the solder paste preferred for use comprises (a) 55–65 wt % 62.5 Ga, 21.5 In, 16 Sn—liquid component and (b) 35–45% Cu–20 Sn mechanically alloyed solid solution.

The liquid component and mechanically alloyed solid solution are mixed in the desired proportions in a vibrating pan or the like for a period of about 10 seconds–5 minutes, preferably 2 minutes to form the desired Ga containing solder paste. Temperature during this mixing step is regulated to be between about 15° C. to 30° C., preferably 24° C.

Once the solder paste is obtained, it should be used within about 30 minutes or so; otherwise, it will prematurely solidify. The paste substance is then coated in a thin layer of about 200 um to 1,000 um along the target and backing plate surfaces to be bonded. The surfaces to be joined should be cleaned via sand blasting or the like prior to the bonding method. A compression force may be exerted perpendicular to the coated layer to aid bonding.

Of significant advantage is the fact that the paste can be applied to the target/backing plate interfacial surfaces with little or no heating of these parts. In contrast, with many of the prior art soldering arrangements, higher temperature heating of the parts during solder application was required. This oftentimes resulted in the warpage and part cracking problems noted supra. In accordance with the invention, these problems are minimized since the solder paste may be applied at about room temperature (i.e. 30°–40° C. or less) or with a slight heating requirement (i.e. heating up to about 100° C.)

After application, the paste is allowed to solidify over a period of from 16 to 48 hours at temperatures ranging from ambient up to about 100° C., preferably 24° C. This solidification or curing step may be conducted in the presence of air, under an inert gas blanket such as an argon atmosphere or in a vacuum. Upon solidification, a durable solder bond is formed with the Ga based solder being stable up to about 500° C.

The gallium based solder pastes have proven effective in bonding oxide-ceramic sputter targets, such as indium tin oxide sputter targets, to copper based or stainless steel backing plate members. Additionally, preliminary data has indicated that these solder pastes may be used to join Ti and Ti based alloy targets to Al or Cu based backing plates.

Figure 2:
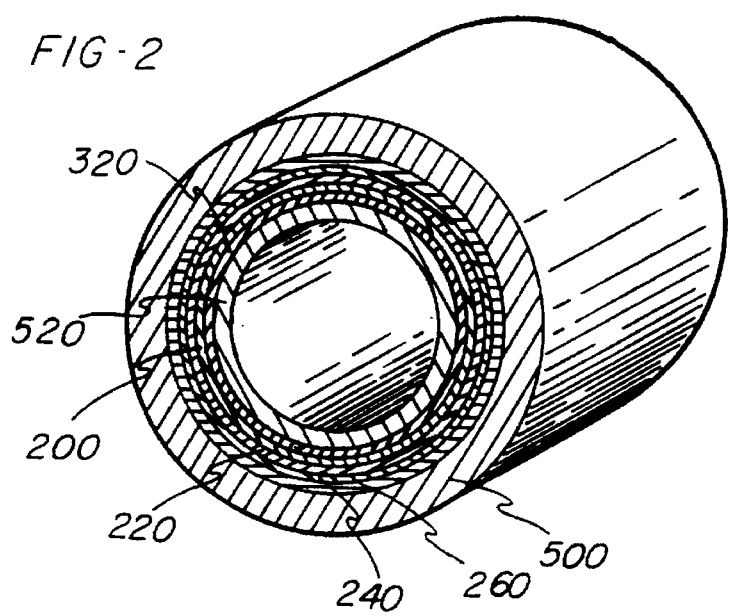
FIG. 2 is a perspective view of another bonded target/backing member assembly in accordance with the invention.

Turning now to FIG. 2 of the drawings, there is shown elongated tubular target 500 composed, in this embodiment, of indium tin oxide. Target 500 is mounted over coaxially disposed tubular backing member 520, here composed of stainless steel. A thin layer of nickel is provided over the outer surface (o.d.) of the backing plate to serve as an adhesive layer 320. Provision of this layer is desired when the backing plate is composed of a difficult to solder material such as stainless steel or aluminum. Layer 320 is from about 0.5–2.0 um in thickness, preferably about 1 um in thickness and is electroplated over the outer circumference of backing plate 520. Adhesive layer 320 provides a suitable substrate for application of solder thereon.

Water, not shown, may be circulated through the inside of tubular backing plate 520 so as to dissipate heat resulting from the sputtering operation. As shown, solderable layer 200 of copper is coated over adhesive layer 320. Layer 200 is from about 1–5 um in thickness; preferably about 2-um. Solderable layer 200 may be sputter coated over the top surface of adhesive layer 320 although other conventional coating methods may be used.

Overlying solderable layer 200, a solder coating 220 of from about 25 to 1000 ums, preferably 500 microns in thickness, of indium, tin, or Sn—Ag solder is provided. The particular solder to be used is chosen carefully so that it will not melt during the cathodic sputtering process.

Accordingly, when oxide ceramic targets are employed in conventional sputtering apparatus, operating temperature of the target/backing plate assembly is normally maintained at about 100° C. or less. Here, the solder should be chosen to have a m.p. in excess of this temperature. In, melting at about 155° C., and Indium based solders such as certain of the In/Sn, In/Pb, and In/Sn/Pb solders may therefore be used as solder layer 220 in these situations. Exemplary solders include In 48 Sn; In 15 Pb; In 18 Pb 70 Sn; In 50 Pb and In 25 Pb. These solder materials therefore have liquidus temperatures within the range of about 100°–200° C.

Since the target shown in FIG. 2 is an oxide ceramic target, it is also desirable to place a thin solderable layer 260 of copper or other solderable material along the inside or i.d. surface of the target. Similar to layer 200, solderable layer 260 has a thickness of about 1 to 5 um in thickness and may be sputter coated along the bottom surface of the target. Solderable layer 260 provides a suitable surface for adherence of bonding material, namely metallic solder paste material thereto.

Tubular target 500 is bonded to tubular backing plate 520 along the tubular interface defined between the target and backing member (i.e. between layers 260, 220) by a solder paste material 240. In order to make this bond, the tubular interface or annular gap is filled with solder paste and allowed to cure or solidify as mentioned previously. Use of solder paste 240 has proven advantageous in bonding such cylindrical or annular interfacial surfaces since conventional liquid solders would tend to run off of these surfaces.

Provision of solder layer 220 between the backing plate 520 and solder paste 240 provides a convenient mechanism to separate the backing plate from the target after the target has been consumed during the normal sputtering process. More specifically, the liquidus temperature of the solder layer 220 is much lower than the decomposition temperature of solder paste 240. Accordingly, the spent assembly can be heated to the m.p. of layer 220 and the backing plate easily removed from inside the target. After cleaning, the backing plate can be used again and is ready for subsequent bonding to a fresh target.

Figure 3:
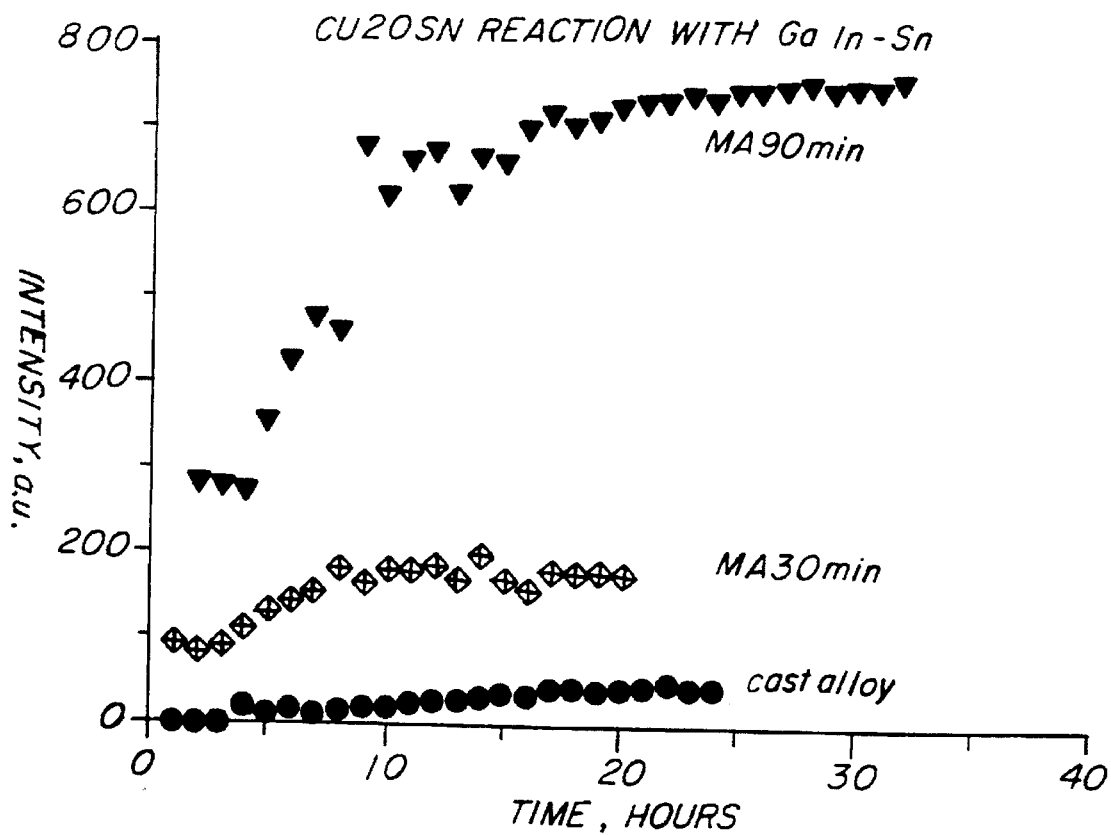
FIG. 3 is a graph showing the relationship between curing time of the solder paste bonding material and x-ray diffraction intensity, signifying formation of desirable intermetallic bonds.

FIG. 3 indicates that the mechanically alloyed Cu 20 Sn solid solution, as mixed in a ball mill for 90 minutes, provides the most intense x-ray diffraction when compared to a 30 minute mechanical alloying or a cast alloy of Cu 20 Sn.

X-ray diffraction intensity is related to formation of the desirable $CuGa_2$ intermetallic compound indicating that more of this intermetallic is formed when the 90 minute mechanical alloy of Cu 20 Sn is used. These intermetallic compounds provide tenacious, durable bonds.

The X axis in FIG. 3 corresponds to the time period in which the Cu 20 Sn solid solution/Ga—In—Sn liquid alloy, mixed together to form solder paste, is allowed to solidify or cure.

The preceding description and accompanying drawing are intended to be illustrative of the invention and not limiting. Various other modifications and applications will be apparent to one skilled in the art without departing from the true spirit and scope of the invention as defined by the following claims.

What is claimed is:

1. Method of solder bonding a sputter target to a backing plate member with a solder paste, said method comprising the steps of:

a) providing a liquid component including Ga or Ga alloy;
   b) providing a first solid metal powder component (i) selected from the group consisting of groups IB, VIII, and IVB of the periodic chart;
   c) providing a second solid metal powder component (ii) selected from the group consisting of groups IVA, IIIA and VA of the periodic chart;
   d) mechanically alloying said first metal component (i) and said second metal component (ii) to form a solid solution;
   e) mixing said solid solution and said liquid component to form said solder paste;
   f) applying a thin coating of said solder paste to an interface defined by adjacent surfaces of said target and said backing plate member; and
   g) allowing said solder paste to solidify.

2. Method as recited in claim 1 wherein said step (d) comprises mechanically alloying said first metal powder component (i) and said second metal powder component (ii) to form particle sizes on the order of about 5–100 microns in said solid solution.

3. Method as recited in claim 2 wherein said solid solution has crystal sizes of about 2–100 nm.

4. A method as recited in claim 3 wherein said step (f) comprises applying said solder paste at room temperature.

5. A method as recited in claim 4 wherein said step (g) comprises curing said solder paste at a temperature of ambient to 100° C.

6. A method as recited in claim 5 wherein said liquid component further comprises an alloying element selected from In and Sn and mixtures thereof.

7. A method as recited in claim 6 wherein said liquid component comprises eutectic Ga—In—Sn liquid alloy.

8. A method as recited in claim 7 wherein said liquid component comprises 62.5 Ca, 21.5 In, 16 Sn.

9. A method as recited in claim 6 wherein said liquid component comprises 63.14 In, 32.10 Bi, 4.76 Ga.

10. A method as recited in claim 1 wherein i) comprises a member or members selected from Cu, Fe, Co, Ni, or Ti; and ii) comprises a member or members selected from Ge, Sn, Pb, Al, Ca, In and Bi.

11. A method as recited in claim 10 wherein said solid solution comprises Cu—Sn.

12. A method as recited in claim 11 wherein said step (d) comprises mixing said Cu and Sn in a ball mill.

13. Method of bonding a sputter target to a backing plate with a solder paste comprising:

(a) providing a sputter target composed of an oxide ceramic material (b) providing a backing plate;

(c) providing a liquid component for said solder paste, said liquid component comprising gallium or gallium alloy;

(d) providing a first solid component for said solder paste, said first solid component comprising a metal powder selected from the group consisting of groups IB, VIII and IVB of the periodic chart;

(e) providing a second solid component for said solder paste, said second solid component comprising a metal powder selected from the group consisting of groups IVA, IIIA and VA of the periodic chart;

(f) mechanically alloying said first solid component and said second solid component to form a solid solution;

(g) mixing said solid solution and said liquid component together in an amount by weight of about 75 wt %–35% liquid component, about 25 wt %–65 wt % solid solution, to form said solder paste;

(h) applying a thin coating of said solder paste material between adjacent surfaces of said sputter target and said backing plate; and (i) allowing said solder paste to solidify.

14. A method as recited in claim 13 wherein said solid solution comprises a member selected from the group of Cu—Sn, Cu—In and Cu—Bi.

15. A method as recited in claim 14 wherein said oxide ceramic target comprises indium tin oxide.

16. A method as recited in claim 14 wherein said backing plate comprises copper or copper alloy.

17. Method of bonding a sputter target to a backing plate member with a solder paste comprising:

(a) providing a sputter target composed of Ti or Ti alloy;

(b) providing a backing plate;

(c) providing a liquid component containing gallium or gallium alloy;

(d) providing a first solid metal powder component (i) selected from the group consisting of groups IB, VIII, and IVB of the periodic chart;

(e) providing a second solid metal powder component (ii) selected from the group consisting of groups IVA, IIIA, and VA of the periodic chart;

(f) forming a solid solution by mechanically alloying said components (i) an (ii) ;

(g) forming said solder paste by mixing said liquid component with said solid solution wherein said liquid is present in an amount of about 75 wt %–35 wt % based on the total weight of said liquid component and said solid solution, said solid solution component being present in an amount of about 25 wt %–65 wt %;

(h) applying a thin coating of said solder paste between adjacent surfaces of said sputter target and said backing plate; and (i) allowing said solder paste to solidify.

18. A method as recited in claim 17 wherein said solid solution comprises a member selected from the group consisting of Cu—Sn, Cu—In, and Cu—Bi.

19. A method as recited in claim 17 wherein said backing plate comprises copper or copper alloy.

20. A method as recited in claim 17 wherein said backing plate comprises aluminum or aluminum alloy.

21. Method of bonding a sputter target to a backing plate member with a solder paste comprising:

(a) providing a tubular target;

(b) providing a tubular backing member;

(c) placing said tubular target around said tubular backing member with said tubular target and tubular backing member disposed in substantially coaxial relation, with an annular gap defined by interfacial surfaces of said target and backing member;

(d) providing a liquid component including Ga or Ga alloy;

(e) providing a first solid metal powder component (i) selected from the group consisting of groups IB, VIII, and IVB of the periodic chart;

(f) providing a second solid metal powder component (ii) selected from the group consisting of groups IVA, IIIA, and Va of the periodic chart;

(g) mechanically alloying said first metal component (i) and said second metal component (ii) to form a solid solution;

(h) mixing said solution and said liquid component to form said solder paste;

(i) applying said solder paste to said annular gap; and (j) allowing said solder paste to solidify.

22. A method as recited in claim 21 wherein said target is composed of indium tin oxide.

23. A method as recited in claim 21 wherein said backing plate is composed of stainless steel.

24. A method as recited in claim 21 wherein said step (i) comprises applying said solder paste at room temperature.

25. A method as recited in claim 24 wherein said step (j) comprises curing said solder paste at a temperature of ambient to 100° C.

26. A method as recited in claim 21 wherein said liquid component comprises a member selected from the group consisting of elemental Ga, and an alloying element selected from In and Sn and mixtures thereof.

27. A method as recited in claim 26 wherein said liquid component comprises eutectic Ga—In—Sn liquid alloy.

28. A method as recited in claim 27 wherein said liquid component comprises 62.5 Ca, 21.5 In, 16 Sn.

29. A method as recited in claim 21 wherein said liquid component comprises 63.14 In, 32.10 Bi, 4.76 Ga.

30. A method as recited in claim 21 wherein i) comprises a member or members selected from Cu, Fe, Co, Ni, or Ti; and ii) comprises a member or members selected from Ge, Sn, Pb, Al, Ga, In and Bi.

31. A method as recited in claim 30 wherein said solid solution component comprises Cu—Sn.

32. A method as recited in claim 21 wherein said step of mechanically alloying comprises mixing in a ball mill.

* * * * *